United States Patent
Arimai et al.

(10) Patent No.: US 9,735,496 B1
(45) Date of Patent: Aug. 15, 2017

(54) ELECTRONICS UNIT

(71) Applicant: Mitsubishi Electric Corporation, Tokyo (JP)

(72) Inventors: Fumiaki Arimai, Tokyo (JP); Shozo Kanzaki, Tokyo (JP); Hiroyoshi Nishizaki, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/212,434

(22) Filed: Jul. 18, 2016

(30) Foreign Application Priority Data

Mar. 22, 2016 (JP) ................................ 2016-056555

(51) Int. Cl.
| | |
|---|---|
| H01R 13/502 | (2006.01) |
| H01R 12/71 | (2011.01) |
| H01R 13/66 | (2006.01) |
| H01R 13/504 | (2006.01) |

(52) U.S. Cl.
CPC ....... *H01R 13/5025* (2013.01); *H01R 12/716* (2013.01); *H01R 13/504* (2013.01); *H01R 13/665* (2013.01)

(58) Field of Classification Search
CPC .............. H01R 13/665; H01R 112/716; H01R 13/5216; H01R 13/5025; H01R 13/504; H05K 3/28; H05K 3/284; H02G 15/14
USPC ..... 439/79, 620.22, 272–276, 278, 283, 936
See application file for complete search history.

(56) References Cited

U.S. PATENT DOCUMENTS

| | | | | |
|---|---|---|---|---|
| 3,523,216 | A * | 8/1970 | Godwin, Jr. ........... | H02G 15/14 174/564 |
| 5,909,915 | A * | 6/1999 | Okuda ................... | H05K 3/284 174/521 |
| 8,717,766 | B2 * | 5/2014 | Arimai ................... | H05K 3/284 257/706 |
| 2013/0288541 | A1 | 10/2013 | Nagamine | |
| 2014/0226295 | A1 | 8/2014 | Nishio et al. | |
| 2016/0309600 | A1* | 10/2016 | Kajiwara ............. | B23K 35/226 |

FOREIGN PATENT DOCUMENTS

| | | |
|---|---|---|
| EP | 2 635 098 A1 | 9/2013 |
| JP | 7-7184 U | 1/1995 |
| JP | 2008-98063 A | 4/2008 |
| JP | 2010-67773 A | 3/2010 |

(Continued)

OTHER PUBLICATIONS

Communication dated May 30, 2017 from the Japanese Patent Office in counterpart application No. 2016-056555.

*Primary Examiner* — Harshad Patel
(74) *Attorney, Agent, or Firm* — Sughrue Mion, PLLC; Richard C. Turner (57) ABSTRACT

A circuit board with circuit components mounted thereon is integrally molded with a sealing resin having a sealed end face part that is a thermosetting resin. A cylindrical intermediate adapter is bonded and fixed to the sealed end face part with an opening into which a receptacle body of a connector housing is inserted. A resilient contact connected to a lead wire is caused to be in electrical contact with a copper foil trace terminal of the circuit board. The connector housing and the intermediate adapter are made of a thermoplastic resin resistant to crack failure, which improves handling capability for inserting and withdrawing a connector.

8 Claims, 7 Drawing Sheets

(56) References Cited

FOREIGN PATENT DOCUMENTS

| JP | 2013-80879 A | 5/2013 |
| JP | 2013-110042 A | 6/2013 |
| JP | 2013-182299 A | 9/2013 |
| JP | 2013-232312 A | 11/2013 |

\* cited by examiner

ELECTRONICS UNIT

BACKGROUND OF THE INVENTION

Field of the Invention

The present invention relates to an electronics unit having a resin-sealed structure in which a circuit board with an electronic component mounted thereon includes a card-edge terminal for electrically connecting the circuit board detachably to an equipment external to the circuit board, and particularly relates to an improvement of the attachment mechanism between a connector housing connected to an external wiring and the main body of the electronics unit.

Description of the Related Art

An electronic control unit in which a circuit board with an electronic component mounted thereon includes at its edge a card-edge terminal for external connection which are integrally molded with a sealing resin is well known. For example, according to FIGS. 2 and 3 of PTL 1 listed below, "CARD MEMBER AND CARD-EDGE CONNECTOR," a board 12 having a card-edge part 14 with a plurality of card-edge terminals 13 to be connected to a counterpart connector 31 formed at least on one side of the card-edge part 14, and a card member 11 including a cover body 15 covering the board 12 are provided, in which the cover body 15 includes an opening 26 through which at least the card-edge terminals 13 are exposed and a container 18 filled with filling material and containing the board 12.

Also, in a card-edge connector 10, the card member 11 is connected to the counterpart connector 31, which protects the card-edge terminals from an impact of falling or the like and provides the card member and card-edge connector having superior waterproofing capability. Note that, according to FIG. 12, a card member 11A can be molded using molds 43, 44. Note that the above reference numerals are ones used in PTL 1.

According to FIG. 3 of PTL 2 listed below, "ELECTRIC/ELECTRONIC CONTROL UNIT AND METHOD FOR MANUFACTURING THE SAME," electronic components 1a, 1b mounted on a circuit board 2 are resin-sealed by a transfer mold molding method using a thermosetting resin 5, then an external connection terminal 3 is solder-mounted on the circuit board 2 and integrally molded by an injection molding method using a thermoplastic resin 7 to configure a connector 60 from part of the thermoplastic resin 7, which can suppress decrease in productivity due to increase in size of an electronic circuit board and can eliminate the need for previously forming a connector housing 4 using a thermosetting resin shown in FIG. 1. Note that the above reference numerals are ones used in PTL 2.

[PTL 1] JP-A-2013-182299 (FIG. 2, FIG. 3, Abstract, Paragraph 0001, FIG. 12, Paragraph 0066)

[PTL 2] JP-A-2010-067773 (FIG. 1, Abstract, FIG. 3, Paragraph 0048, Paragraph 0051)

(1) Description of Problem of Prior Art

According to the PTL 1, the cover body 15 of the card member 11 is connected to a housing 32 of the counterpart connector 31 such that a plurality of engaging projections 19 are fitted into a plurality of engaging grooves 35 and the cover body 15 and the housing 32 are fixed to each other by a locking part 20 and a locking mechanism 36.

However, when the card member 11 with the counterpart connector 31 not connected thereto is transported and delivered to a site at which assembly should be performed, the card-edge part 14 is exposed, so, the card-edge terminals 13 cannot be protected. Also, when the card member 11 is connected at the site, the engaging projections 19 and the engaging grooves 35, and the locking part 20 and the locking mechanism 36 may be damaged.

This problem tends to occur when the cover body 15 is made of a thermosetting sealing resin and integrally molded with the board 12. In order to improve the strength of the sealing resin, with high hardness and prone to crack failure, the thickness of the high-cost thermosetting sealing resin needs to be increased. Note that the above reference numerals are ones used in PTL 1.

According to the PTL 2, the connector 60 is protected by the thermoplastic resin 7 and the thermoplastic resin 7 is not damaged by the insertion and withdrawal of the counterpart connector not shown. However, two stages of component mounting process (for the electronic components 1a, 1b and external connection terminal 3), two stages of soldering process (for the electronic components 1a, 1b and external connection terminal 3) and two stages of assembling and molding process (for transfer molding using the thermosetting resin 5 and injection molding using the thermoplastic resin 7) are needed, which poses a problem of requiring large scale equipment and increasing the product price. Note that the above reference numerals are ones used in PTL 2.

SUMMARY OF THE INVENTION (2) Object of Invention

It is an object of the present invention to provide a low-cost electronics unit in which a circuit component and a circuit board having a card-edge terminal are integrally molded with a thermosetting resin to which a connector housing for external connection is attached, wherein the card-edge terminal is protected in a process of transporting and transferring the electronics unit, and attaching the connector housing does not cause a resin crack in the sealing resin.

The electronics unit in accordance with the invention is a card-edge terminal type electronics unit including a circuit board on which a plurality of circuit components are mounted, the circuit board including a plurality of copper foil trace terminals provided on at least one surface of the top and bottom surfaces of the edge of a first side or a second side in parallel with the first side of the circuit board, the copper foil trace terminals being pressed by a copper-based resilient contact, wherein the circuit board and the plurality of circuit components are integrally molded with a sealing resin that is a thermosetting resin excepting a board edge area in which the copper foil trace terminals are provided, wherein a cylindrical intermediate adapter has one opening bonded and fixed to a sealed end face part that is included in a board area close to the board edge area and is part of the sealing resin and has the other opening that surrounds the board edge area, wherein a receptacle body of a connector housing is inserted into the other opening, the connector housing including the resilient contact press-fitted and fixed thereto and connected to a lead wire for external connection, which causes the resilient contact to be in electrical contact with the copper foil trace terminals, wherein the connector housing and the intermediate adapter are each formed of a thermoplastic resin, and a set of insertable and withdrawable retaining attachment mechanism is provided to one and the other of the connector housing and the intermediate adapter, wherein the connector housing further includes a positioning projection press-fitted and fixed thereto, the positioning projection being fitted into a notched groove provided in the end face of the circuit board, and wherein the intermediate adapter is bonded to the sealed end face part of the sealing resin with an adhesive material that is an elastic adhesive material having an adhesive viscosity enough to prevent peeling caused by thermal deformation due to difference in linear expansion coefficient between the intermediate adapter and the sealing resin.

As described above, the electronics unit in accordance with the invention is an electronics unit in which: a plurality of circuit components and a circuit board are integrally molded with a thermosetting sealing resin; a plurality of copper foil trace terminals are provided on the edge of the circuit board exposed from the sealing resin; and the copper foil trace terminals are pressed by a resilient contact for external connection attached to a connector housing, wherein (1) a cylindrical intermediate adapter is bonded and fixed with an elastic adhesive material to a sealed end face part of the sealing resin at which the copper foil trace terminals are exposed, (2) the connector housing and the intermediate adapter are each formed of a thermoplastic resin, and a set of insertable and withdrawable retaining attachment mechanism is provided to one and the other of the connector housing and the intermediate adapter, and (3) the connector housing further includes a positioning projection press-fitted and fixed thereto, the positioning projection being fitted into a notched groove provided in the end face of the circuit board.

Accordingly, two stages of solder-mounting process and two stages of assembling and molding process are not needed, and the copper foil trace terminals are protected by a simple means in the process of transporting and distributing the electronics unit including the intermediate adapter, and the sealing resin, with high hardness and prone to crack failure, is protected when the connector housing is attached and fixed in the process of connecting to an external equipment, which provides an effect of improving handling capability of the product.

Furthermore, the connector housing and the intermediate adapter are formed of the same material to have the same linear expansion coefficient, which stabilizes the gap size in the direction of insertion and withdrawal of the connector housing and the intermediate adapter against the change in environment temperature to suppress the oscillation amplitude of portions in contact. Also, the relative positional relationship between the connector housing and the circuit board is restricted by a notched groove provided in the circuit board, which provides an effect of suppressing dimension error due to thermal deformation and decreasing the spacing between the copper foil trace terminals to allow the resilient contact to be arranged in high density.

The foregoing and other objects, features, aspects and advantages of the present invention will become more apparent from the following detailed description of the present invention when taken in conjunction with the accompanying drawings.

DETAILED DESCRIPTION OF THE PREFERRED EMBODIMENTS

First Embodiment (1) Detailed Description of Configuration and Effect

Figure 1A:
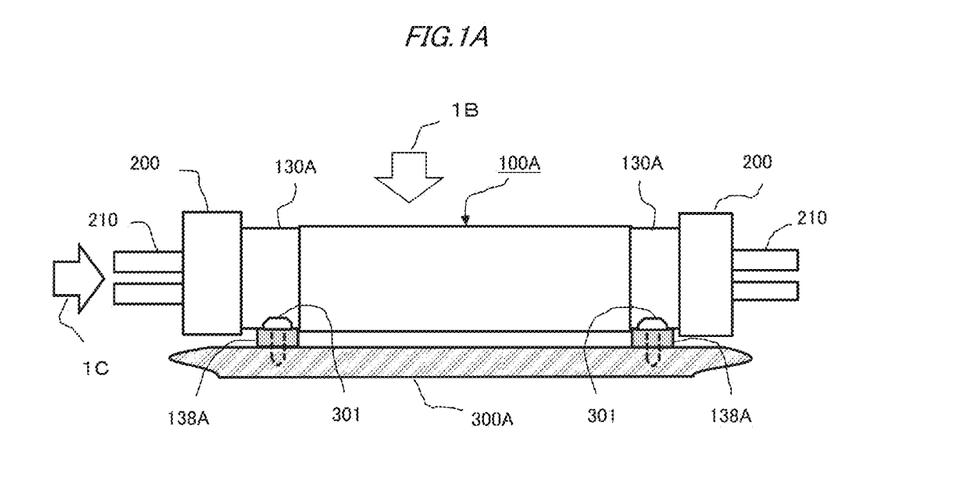
FIG. 1A is an external side view of an electronics unit in accordance with a first embodiment of the invention.
Figure 1B:
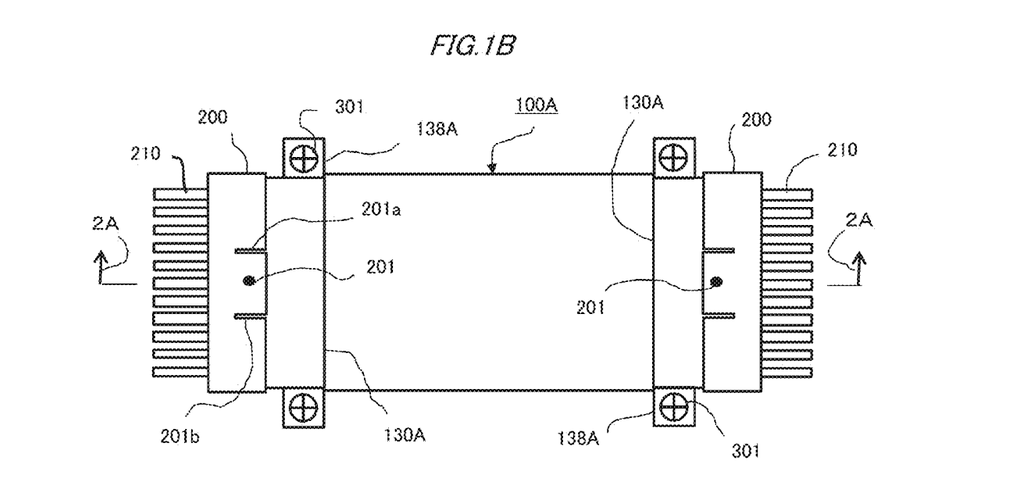
FIG. 1B is an external top view in the direction of arrow 1B in FIG. 1A.
Figure 1C:
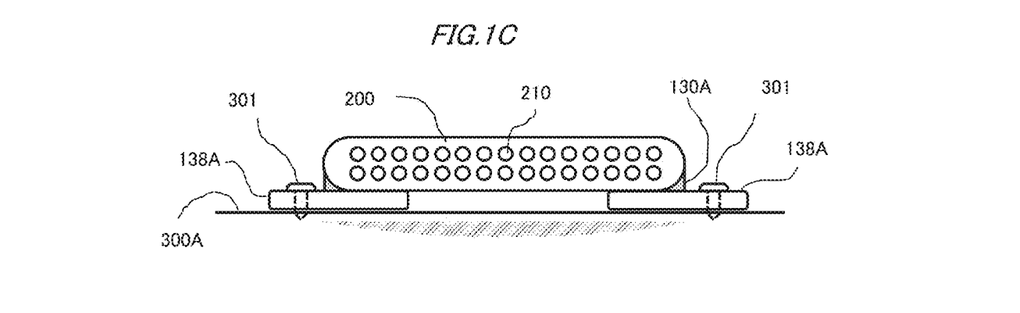
FIG. 1C is an external end view in the direction of arrow 1C in FIG. 1A.

First, an external configuration of an electronics unit 100A in accordance with a first embodiment of the invention is described with reference to FIGS. 1A to 1C. FIG. 1A is an external side view of the electronics unit 100A. FIG. 1B is an external top view in the direction of arrow 1B in FIG. 1A. FIG. 1C is an external end view in the direction of arrow 1C in FIG. 1A.

In FIGS. 1A to 1C, a pair of connector housings 200 bundling a plurality of lead wires 210 are insertably and withdrawably attached to the right and left ends of the electronics unit 100A and connected to an external equipment not shown.

Note that a pair of intermediate adapters 130A are bonded and fixed to the right and left ends of the electronics unit 100A. Also, the pair of connector housings 200 includes a resilient hook 201 separated from an outer shell 203 (see FIG. 2A) by notched grooves 201a, 201b (see FIG. 1B), which configures one side of an attachment mechanism. The intermediate adapter 130A includes a retaining engagement part 131 (see FIG. 2A) which configures the other side of the attachment mechanism. This attachment mechanism 201, 131 allows the connector housing 200 to be insertably and withdrawably attached to the electronics unit 100A through the intermediate adapter 130A.

Furthermore, each of the pair of intermediate adapters 130A includes a mounting foot 138A which is attached and fixed to a mounting surface 300A with two attaching screws 301 for each of the right and left ends.

Figure 2A:
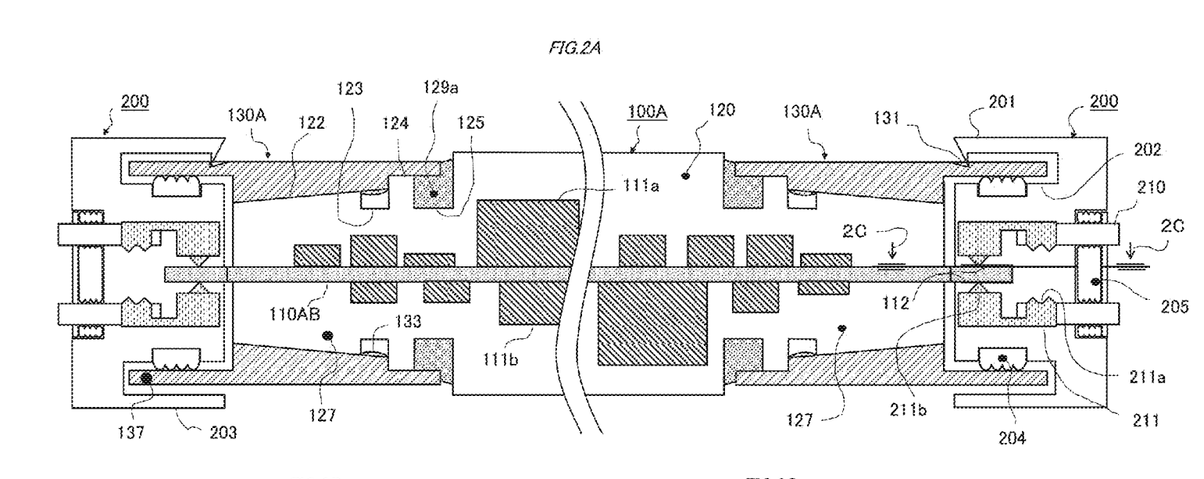
FIG. 2A is a cross-sectional side view taken along the line indicated by the arrows 2A-2A in FIG. 1B.
Figure 2B:
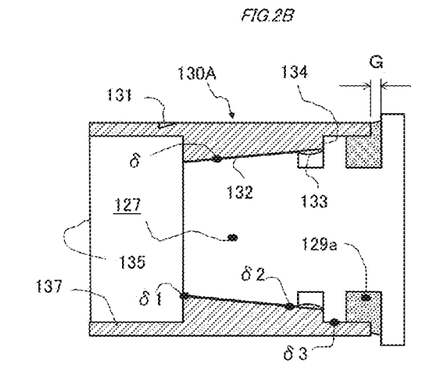
FIG. 2B is a cross-sectional partial view of a sealed end face part in FIG. 2A.
Figure 2C:
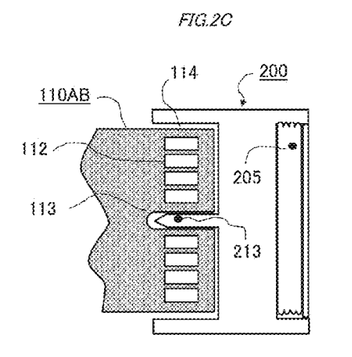
FIG. 2C is a partial plan view of the circuit board seen along the line indicated by the arrows 2C-2C in FIG. 2A.

Next, FIGS. 2A to 2C are described in detail. FIG. 2A is a cross-sectional side view taken along the line indicated by the arrows 2A-2A in FIG. 1B. FIG. 2B is a cross-sectional partial view of the sealed end face part in FIG. 2A. FIG. 2C is a partial plan view of the circuit board seen along the line indicated by the arrows 2C-2C in FIG. 2A.

In FIGS. 2A to 2C, the electronics unit 100A includes a circuit board 110AB that is, for example, a glass epoxy board and a plurality of circuit components 111a, 111b solder-mounted on the top and bottom sides of the circuit board 110AB, which are integrally molded with a sealing resin 120 that is a thermosetting resin, such as epoxy resin. The sealing resin 120 includes sealed end face parts 127 at the right and left ends. The circuit board 110AB includes a plurality of copper foil trace terminals 112 on a board edge area 114 (see FIG. 2C) protruding from the sealed end face part 127.

The right and left sealed end face parts 127 as a part of the sealing resin 120 include a fitting taper portion 122, an outer concave portion 123, an intermediate convex portion 124 and an inner concave portion 125 in series, in which "inner" means closer to the center of the electronics unit 100A, and "outer" means away from the center.

The fitting taper portion 122 has a slope angle such that the outline size increases from outer portion to inner portion. The outer concave portion 123, the intermediate convex portion 124 and the inner concave portion 125 are configured in a ring shape.

Note that an inner adhesive material 129a that has adhesive property and flexibility, such as a silicone-based material, is applied in a ring shape to the inner concave portion 125.

The pair of intermediate adapters 130A bonded and fixed to the right and left sealed end face parts 127, respectively, are a cylindrical part made by injection-molding a thermoplastic resin, such as poly butylene terephthalate (PBT). The intermediate adapter 130A includes a fitting taper hole 132 (see FIG. 2B), a plurality of fitting protrusions or a ring-shaped fitting protrusion 133, and a fitting abutting face 134. Note that the fitting protrusion(s) 133 is forcibly fitted into an opening of the outer concave portion 123.

The intermediate adapter 130A has a step provided on the inner periphery face and includes the fitting abutting face 134 abutting against the outer wall face of the intermediate convex portion 124. The inner end face of the intermediate adapter 130A faces the inner wall face of the inner concave portion 125 with an end face gap G in between (see FIG. 2B).

The sealed end face part 127 is inserted into the intermediate adapter 130A through one opening (inner opening) and the fitting abutting face 134 abuts against the outer wall face of the intermediate convex portion 124, which makes a very small taper gap δ between the fitting taper hole 132 and the fitting taper portion 122. The slope angles of the fitting taper portion 122 and the fitting taper hole 132 are defined such that the orthogonal direction gap size (gap size in the right angle direction with respect to the tapered face) of the taper gap δ increases from an outer gap δ1 (see FIG. 2B) to an inner gap δ2 (see FIG. 2B).

Note that the outer gap δ1 and the gap size of the end face gap G with the fitting abutting face 134 abutting against the intermediate convex portion 124 has a desired size defined to be at least zero or more even when size variation and thermal deformation of the sealed end face part 127 and the intermediate adapters 130A are taken into consideration.

Furthermore, an extended hollow portion 137 is provided between the other opening 135 (outer opening) of the intermediate adapter 130A and the sealed end face part 127, which surrounds the board edge area 114 (see FIG. 2C).

The connector housing 200 includes a receptacle body 202 into which a connection terminal 211 (see FIG. 2A) is press-fitted and the outer shall 203 having the resilient hook 201. The connection terminal 211 includes a wire crimping portion 211a for crimping and holding the end of the lead wire 210 and a copper-based resilient contact 211b. Note that, in a fitting gap made between the receptacle body 202 of the connector housing 200 and the extended hollow portion 137 of the intermediate adapter 130A, a connector seal 204 made of, for example, silicone rubber is inserted. Also, the lead wire 210 is waterproof sealed with a wire seal 205 attached to the end face of the receptacle body 202.

Furthermore, a positioning projection 213 press-fitted into the receptacle body 202 of the connector housing 200 is fitted into a notched groove 113 (see FIG. 2C) provided in the board edge area 114 of the circuit board 110AB, which restricts the relative positional relationship between the circuit board 110AB and the connector housing 200.

With the configuration as described above, when the inner adhesive material 129a is applied to the inner concave portion 125, the inner side of the sealed end face part 127 is aimed upward, then, an injection nozzle for creamy adhesive material is moved around and along the inner concave portion 125, and then, the tapered ending portion of the application is caused to overlap with the tapered starting portion to finish the application.

Next, the intermediate adapter 130A loaded on a fabrication jig is fitted onto the sealed end face part 127, and is pressed upward until the fitting abutting face 134 abuts against the wall face of the intermediate convex portion 124. At this time, the fabrication jig includes a dummy projection corresponding to the positioning projection 213 (see FIG. 2C) of the connector housing 200, and the dummy projection is fitted into the notched groove 113 of the circuit board 110AB to prevent the relative positional relationship between the intermediate adapter 130A and the circuit board 110AB from being misaligned. Note that, when a very small fitting gap δ3 (see FIG. 2B) made between the outer periphery wall of the intermediate convex portion 124 and the inner periphery wall of the intermediate adapter 130A is relatively large due to variation in size of the various portions, the intermediate adapter 130A is fitted onto the sealed end face part 127, then the fitting abutting face 134 abuts against the outer wall of the intermediate convex portion 124, and then part of the inner adhesive material 129a flows into and fills this allowance gap to allow attachment with a small amount of fitting backlash.

The above described outer gap δ1 and inner gap δ2 have a maximum value of, for example, 0.1 mm (δ1) and 0.2 mm (δ2), and also have an estimated fluctuation range due to variation in size and thermal deformation of the various portions of 0 to 0.1 (δ1) and 0.1 to 0.2 (δ2). The outer gap δ1, inner gap δ2 and fitting gap δ3 as a design standard value have a relation of δ1≤δ3<δ2.

In the above description, as an attachment mechanism between the connector housing 200 and the intermediate adapter 130A, the resilient hook 201 of the connector housing 200 side and the retaining engagement part 131 of the intermediate adapter 130A side are used. In addition, a rotatable lever not shown may also be used as an insertion and withdrawal mechanism of the connector housing 200. This insertion and withdrawal assistance mechanism can stably hold the attachment.

Also, the bonding mechanism between the connector housing 200 and the intermediate adapter 130A shown in FIGS. 2A and 2B can be replaced by a bonding mechanism in another embodiment and its modification described later with reference to FIG. 4A, FIGS. 5A and 5B, and FIG. 7A. This also applies to still another embodiment and its modification.

(2) Detailed Description of Modification

Figure 3A:
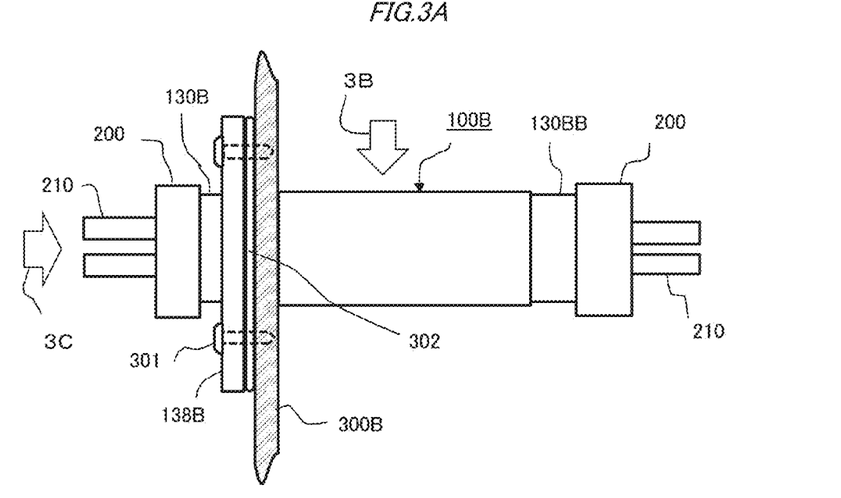
FIG. 3A is an external side view of an electronics unit in accordance with a modification of the first embodiment of the invention.
Figure 3B:
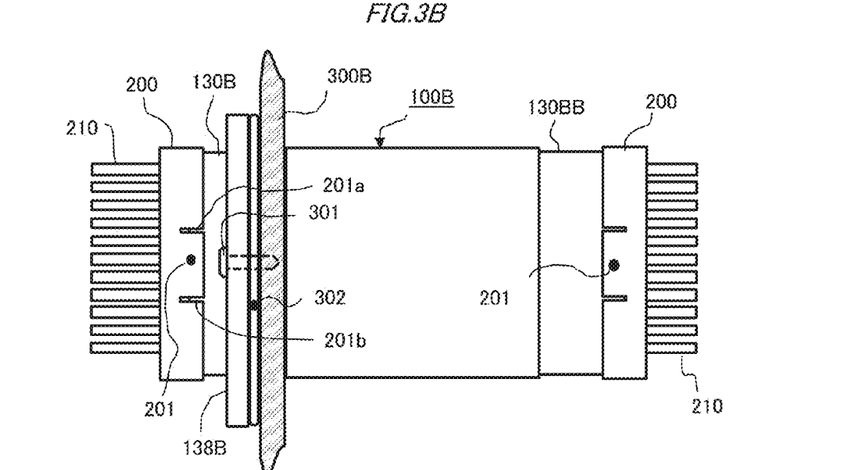
FIG. 3B is an external top view in the direction of arrow 3B in FIG. 3A.
Figure 3C:
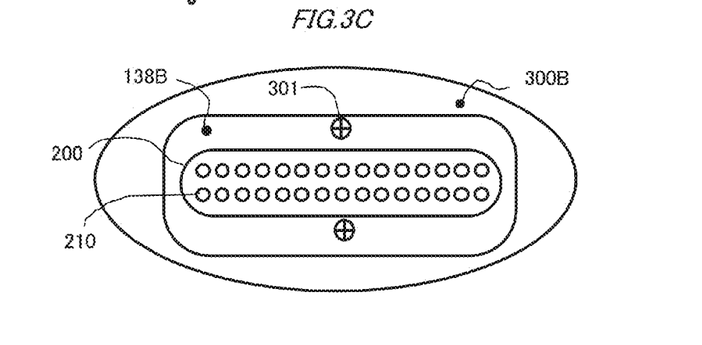
FIG. 3C is an external end view in the direction of arrow 3C in FIG. 3A.

Next, an electronics unit 100B in accordance with a modification of the first embodiment of the invention is described in detail with reference to FIG. 3A to 3C with a focus on the difference from FIGS. 1A to 1C of the first embodiment. FIG. 3A is an external side view of the electronics unit 100B. FIG. 3B is an external top view in the direction of arrow 3B in FIG. 3A. FIG. 3C is an external end view in the direction of arrow 3C in FIG. 3A. A main difference between FIGS. 3A to 3C of the first modification and FIGS. 1A to 1C of the first embodiment is that the first embodiment is installed on a plane, such as a floor or ceiling or wall, whereas the first modification is installed by being fitted into a window hole. Through the drawings, the same or corresponding components are denoted by the same reference numerals. Also, the uppercase alphabetic characters A, B appended to the reference numerals in the drawing indicate components corresponding to each other between the different embodiments, such as an electronics unit A, an electronics unit B. This also applies to a second embodiment and a second modification described later.

In FIGS. 3A to 3C, a pair of connector housings 200 bundling a plurality of lead wires 210 are insertably and withdrawably attached to the right and left ends of the electronics unit 100B and connected to an external equipment not shown. Note that an intermediate adapter 130B having a mounting foot 138B is bonded and fixed to the left end of the electronics unit 100B, and an intermediate adapter 130BB not having a mounting foot is bonded and fixed to the right end of the electronics unit 100B. Also, the pair of connector housings 200 include a resilient hook 201 separated from an outer shell 203 (see FIG. 2A) by notched grooves 201a, 201b already described with reference to FIG. 1B, which configures one side of an attachment mechanism. The intermediate adapter 130B, 130BB includes a retaining engagement part 131 (see FIG. 4A) which configures the other side of the attachment mechanism. This attachment mechanism 201, 131 allows the connector housing 200 to be insertably and withdrawably attached to the electronics unit 100B through the intermediate adapter 130B, 130BB. Note that the electronics unit 100B includes a flange-like mounting foot 138B provided to the intermediate adapter 130B and is mounted and fixed to an mounting surface 300B having a window hole not shown by a fastening screw 301 with a waterproof sheet 302 in between.

Figure 4A:
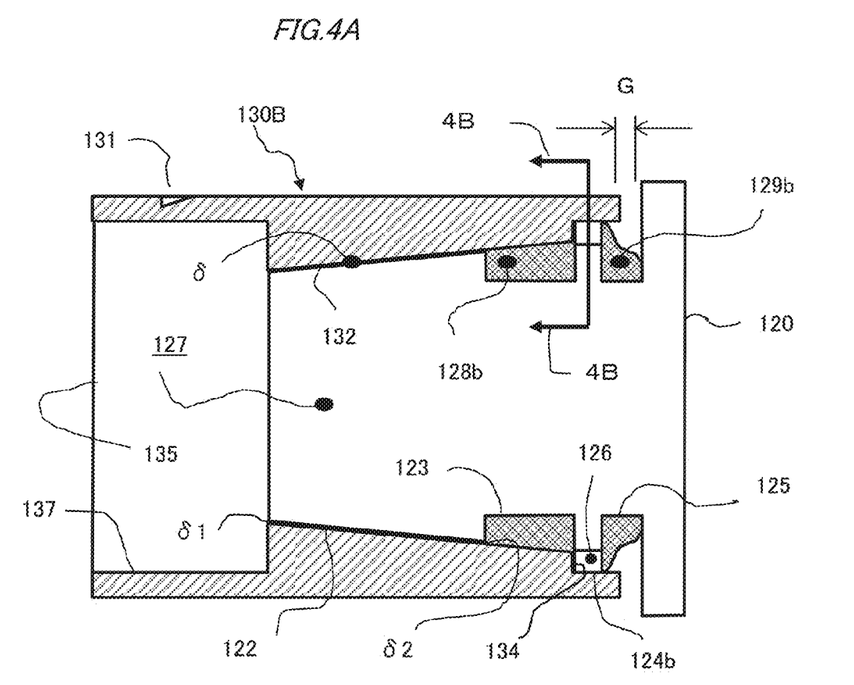
FIG. 4A is a cross-sectional partial view of a sealed end face part in FIG. 3A.
Figure 4B:
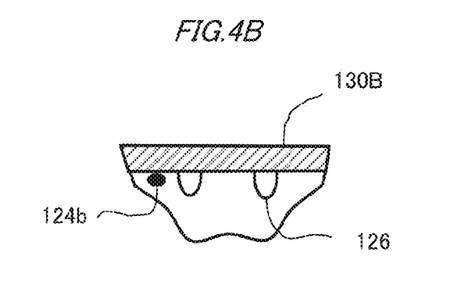
FIG. 4B is a cross-sectional partial view of the sealed end face part seen along the line indicated by the arrows 4B-4B in FIG. 4A.

Next, FIGS. 4A and 4B are described in detail. FIG. 4A is a cross-sectional partial view of the sealed end face part in FIG. 3A. FIG. 4B is a cross-sectional partial view of the sealed end face part seen along the line indicated by the arrows 4B-4B in FIG. 4A. Note that the electronics unit 100B includes the circuit board 110AB previously shown in FIG. 2A and a plurality of circuit components 111a, 111b solder-mounted on the top and bottom sides of the circuit board 110AB, which are integrally molded with a sealing resin 120 that is a thermosetting resin, such as epoxy resin. The sealing resin 120 includes sealed end face parts 127 at the right and left ends.

In FIGS. 4A and 4B, the right and left sealed end face parts 127 as a part of the sealing resin 120 include a fitting taper portion 122, an outer concave portion 123, an intermediate convex portion 124b and an inner concave portion 125 in series, in which "inner" means closer to the center of the electronics unit 100B, and "outer" means away from the center. The fitting taper portion 122 has a slope angle such that the outline size increases from outer portion to inner portion. The outer concave portion 123, the intermediate convex portion 124b and the inner concave portion 125 are configured in a ring shape.

Note that a through channel 126 that is a plurality of depressions is provided in the outer periphery of the intermediate convex portion 124b, then an outer adhesive material 128b applied in a ring shape to the outer concave portion 123 flows into the inner concave portion 125 through the through channel 126 to configure an inner adhesive material 129b in a ring shape. However, in this modification, the groove width of the inner concave portion 125 is reduced and the groove width of the outer concave portion 123 is increased.

The right and left intermediate adapters 130B, 130BB bonded and fixed to the right and left sealed end face parts 127, respectively, are a cylindrical part made by injection-molding a thermoplastic resin, such as poly butylene terephthalate (PBT). The intermediate adapter 130B, 130BB includes a fitting taper hole 132 and a fitting abutting face 134.

The sealed end face part 127 is inserted into the intermediate adapter 130B, 130BB through one opening (inner opening) and the fitting abutting face 134 abuts against the outer wall face of the intermediate convex portion 124b, which makes a very small taper gap δ between the fitting taper hole 132 and the fitting taper portion 122. The slope angles of the fitting taper portion 122 and the fitting taper hole 132 are defined such that the orthogonal direction gap size of the taper gap δ increases from an outer gap δ1 to an inner gap δ2.

The intermediate adapter 130B has a step provided on the inner periphery face and includes the fitting abutting face 134 abutting against the outer wall face of the intermediate convex portion 124b. The inner end face of the intermediate adapter 130B faces the inner wall face of the inner concave portion 125 with an end face gap G in between. The outer gap δ1 and the gap size of the end face gap G with the fitting abutting face 134 abutting against the intermediate convex portion 124b has a desired size defined to be at least zero or more even when size variation and thermal deformation of the sealed end face part 127 and the intermediate adapters 130B are taken into consideration.

Furthermore, an extended hollow portion 137 is provided between the other opening 135 (outer opening) of the intermediate adapter 130B, 130BB and the sealed end face part 127, which surrounds the board edge area 114 (see FIG. 2C). Also, the connector housing 200 inserted into the extended hollow portion 137 is configured in a way similar to that of the FIG. 2A.

With the configuration as described above, when the outer adhesive material 128b is applied to the outer concave portion 123, the inner side of the sealed end face part 127 is aimed upward, then, an injection nozzle for creamy adhesive material is moved around and along the outer concave portion 123, and then, the tapered ending portion of the application is caused to overlap with the tapered starting portion to finish the application.

Next, the intermediate adapter 130B loaded on a fabrication jig is fitted onto the sealed end face part 127, and is pressed upward until the fitting abutting face 134 abuts against the wall face of the intermediate convex portion 124b. At this time, the fabrication jig includes a dummy projection corresponding to the positioning projection 213 (see FIG. 2C) of the connector housing 200, and the dummy projection is fitted into the notched groove 113 of the circuit board 110AB to prevent the relative positional relationship between the intermediate adapter 130B and the circuit board 110AB from being misaligned. Note that, when a very small fitting gap made between the outer periphery wall of the intermediate convex portion 124b and the inner periphery wall of the intermediate adapter 130B or the inner gap δ2 of the taper gap δ is relatively large due to variation in size of the various portions, the intermediate adapter 130B is fitted onto the sealed end face part 127, then the fitting abutting face 134 abuts against the outer wall of the intermediate convex portion 124b, and then part of the outer adhesive material 128b flows into and fills this allowance gap to allow attachment with a small amount of fitting backlash. However, in order to prevent the outer adhesive material 128b from flowing out beyond the outer gap δ1 of the taper gap δ, the size in the direction from inside to outside of the taper gap δ is set to be larger, and the outer gap δ1 is set to be smaller.

(3) Point and Feature of First Embodiment and First modification

As is obvious from the above description, the electronics unit 100A, 100B in accordance with the first embodiment and first modification of the invention is a card-edge terminal type electronics unit 100A, 100B including a circuit board 110AB on which a plurality of circuit components 111a, 111b are mounted, the circuit board 110AB including a plurality of copper foil trace terminals 112 provided on at least one surface of the top and bottom surfaces of the edge of a first side or a second side in parallel with the first side of the circuit board 110AB, the copper foil trace terminals 112 being pressed by a copper-based resilient contact 211b.

The circuit board 110AB and the plurality of circuit components 111a, 111b are integrally molded with a sealing resin 120 that is a thermosetting resin excepting a board edge area 114 in which the copper foil trace terminals 112 are provided.

A cylindrical intermediate adapter 130A, 130B has one opening bonded and fixed to a sealed end face part 127 that is included in a board area close to the board edge area 114 and is part of the sealing resin 120 and has the other opening 135 that surrounds the board edge area 114.

A receptacle body 202 of a connector housing 200 is inserted into the other opening 135, the connector housing 200 including the resilient contact 211b press-fitted and fixed thereto and connected to a lead wire 210 for external connection, which causes the resilient contact 211b to be in electrical contact with the copper foil trace terminals 112.

The connector housing 200 and the intermediate adapter 130A, 130B are each formed of a thermoplastic resin, and a set of insertable and withdrawable retaining attachment mechanism 201, 131 is provided to one and the other of the connector housing 200 and the intermediate adapter 130A, 130B.

The connector housing 200 further includes a positioning projection 213 that is fitted into a notched groove 113 provided in the end face of the circuit board 110AB.

The intermediate adapter 130A, 130B is bonded to the sealed end face part 127 of the sealing resin 120 with an adhesive material 129a, 128b and 129b that is an elastic adhesive material having an adhesive viscosity enough to prevent peeling caused by thermal deformation due to difference in linear expansion coefficient between the intermediate adapter 130A, 130B and the sealing resin 120.

The sealed end face part 127 of the sealing resin 120 includes an intermediate convex portion 124, 124b, an outer concave portion 123 more outer than the intermediate convex portion 124, 124b, and an inner concave portion 125 more inner than the intermediate convex portion 124, 124b, and the outer concave portion 123 is placed closer to the connector housing 200 than the intermediate convex portion 124, 124b.

A fitting taper portion 122 more outer than the outer concave portion 123 is provided, and is fitted into a fitting taper hole 132 of the intermediate adapter 130A, 130B to make a taper gap δ having slope angles.

The slope angles of the fitting taper portion 122 and the fitting taper hole 132 are defined such that the orthogonal direction gap size of the taper gap δ increases from an outer gap δ1 to an inner gap δ2.

The intermediate adapter 130A, 130B has a step provided on the inner periphery face and includes a fitting abutting face 134 abutting against the outer wall face of the intermediate convex portion 124, 124b, and the inner end face of the intermediate adapter 130A, 130B faces the inner wall face of the inner concave portion 125 with an end face gap G in between.

The outer gap δ1 and the gap size of the end face gap G with the fitting abutting face 134 abutting against the intermediate convex portion 124, 124b has a desired size defined to be at least zero or more even when size variation and thermal deformation of the sealed end face part 127 and the intermediate adapters 130A, 130B are taken into consideration.

At least one concave portion of the outer concave portion 123 and the inner concave portion 125 is filled with the adhesive material 129a, 128b and 129b in a ring shape.

As described above, with reference to claim 2 of the invention, the sealed end face part of the sealing resin includes the fitting taper portion, the outer concave portion, the intermediate convex portion and the inner concave portion placed in series, the one opening end of the intermediate adapter fitted onto the sealed end face part faces the inner wall face of the inner concave portion with the end face gap G in between, the intermediate end face is the fitting abutting face that abuts against the outer wall face of the intermediate convex portion, and at least one concave portion of the outer concave portion and the inner concave portion is filled with the adhesive material.

Accordingly, the sealed end face part includes the fitting taper portion, which facilitates the insertion of the intermediate adapter into the sealed end face part of the sealing resin, and restricting the insertion position by the fitting abutting face can reduce the gap size of the taper gap δ to suppress the occurrence of assembly dimension error and can also prevent crack failure of a sealing resin exposed by the one opening end face of the intermediate adapter not abutting against the sealing resin due to thermal deformation.

The intermediate adapter 130A includes a plurality of fitting protrusions or a ring-shaped fitting protrusion 133 provided on the fitting taper hole 132, and the fitting protrusion(s) 133 is forcibly fitted into the outer periphery of the outer concave portion 123 provided in the sealed end face part 127.

The fitting protrusion(s) 133 mechanically prevents the intermediate adapter 130A from coming off the sealed end face part 127.

The inner adhesive material 129a is applied in a ring shape to the inner concave portion 125.

As described above, with reference to claim 3 of the invention, the inner adhesive material is applied in a ring shape to the inner concave portion provided in the sealed end face part, and the fitting protrusion(s) is provided on the fitting taper hole to mechanically hold the intermediate adapter.

Accordingly, the adhesive material with which the inner concave portion is filled can prevent the occurrence of fitting backlash due to dimension error or thermal deformation and maintain waterproofing capability. Note that the inner adhesive material is applied in a ring shape with the sealed end face part exposed, so, the tapered ending portion of the application is caused to overlap with the tapered starting portion to perform gradual joining, which improves waterproofing capability at the joint.

The intermediate adapter 130B is fitted onto the sealed end face part 127 with the outer adhesive material 128b applied in a ring shape to the outer concave portion 123.

The intermediate convex portion 124b includes a through channel 126 that is a plurality of depressions provided in the outer periphery thereof.

The inner adhesive material 129b is provided in the inner concave portion 125 as a result of the outer adhesive material 128b being pressed by the intermediate adapter 130B to overflow through the through channel 126 into the inner concave portion 125.

As described above, with reference to claim 4 of the invention, an excess of the outer adhesive material applied in a ring shape to the outer concave portion flows through the plurality of through channels provided in the outer periphery of the intermediate convex portion into the inner concave portion to be the inner adhesive material.

This can increase the adhesive area of the adhesive material to improve adhesive strength and waterproofing capability. Also, the outer adhesive material is applied in a ring shape with the sealed end face part exposed, so, the tapered ending portion of the application is caused to overlap with the tapered starting portion to perform gradual joining, which improves waterproofing capability at the joint.

The intermediate adapter 130A, 130B, 130BB is bonded and fixed to the sealed end face part 127 of the sealing resin 120 at both the first and second sides of the circuit board 110AB.

At least one of the intermediate adapters 130A, 130B includes a mounting foot 138A, 138B integrated therewith in parallel with or perpendicular to the plane of the circuit board 110AB, and the intermediate adapter 130A, 130B with this mounting foot 138A, 138B is mounted and fixed to an mounting surface 300A, 300B that is an upright or inclined wall face along the vertical direction or a floor or ceiling.

As described above, with reference to claim 7 of the invention, the intermediate adapter includes the mounting foot of the electronics unit integrally molded therewith in parallel with or perpendicular to the circuit board.

Accordingly, various mounting specifications of the electronics unit can be satisfied by replaceably applying an appropriate intermediate adapter.

Furthermore, when a vibration and/or impact is applied to the mounting surface, the vibration and/or impact is absorbed by the adhesive material that secures the intermediate adapter, which can prevent an excess vibration and/or impact from being applied to a key portion of the sealing resin and prevent crack failure of the portion.

The intermediate adapter 130B, 130BB is bonded and fixed to the sealed end face part 127 of the sealing resin 120 at both the first and second sides of the circuit board 110AB.

One of the intermediate adapters 130B, 130BB includes the mounting foot 138B integrated therewith perpendicular to the circuit board 110AB, and the intermediate adapter 130B with this mounting foot 138B is fixed by screw to amounting surface 300B at the surrounding part of an opening window hole of the mounting surface 300B with a waterproof sheet 302 in between.

As described above, with reference to claim 8 of the invention, the intermediate adapter includes the mounting foot of the electronics unit integrally molded therewith perpendicular to the circuit board and attached through the window hole of the mounting surface.

Accordingly, various mounting specifications of the electronics unit can be satisfied by replaceably applying an appropriate intermediate adapter. Also, with an environment space divided by the mounting surface, the electronics unit can be placed in the better side of the environment, and, with the intermediate adapter at both sides of the circuit board, a wire can be routed through from the top side to the bottom side of the mounting surface through the circuit board.

Second Embodiment (1) Detailed Description of Configuration and Effect

Figure 5A:
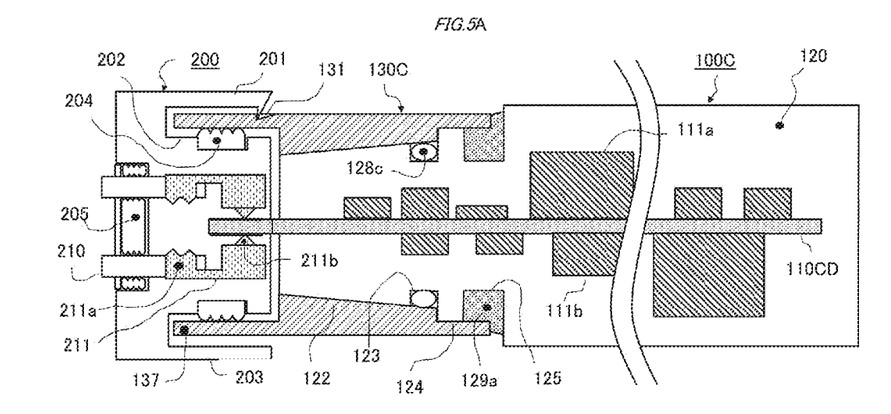
FIG. 5A is a cross-sectional side view of an electronics unit in accordance with a second embodiment of the invention.
Figure 5B:
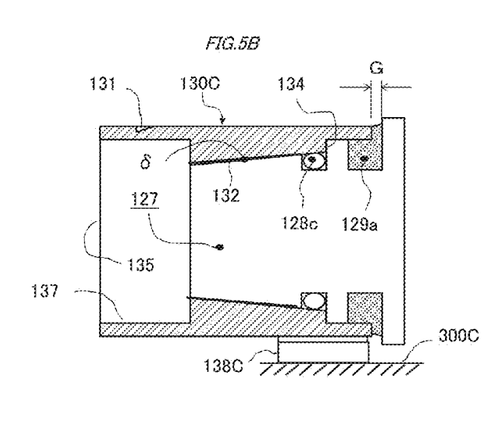
FIG. 5B is a partial cross-sectional view of a sealed end face part in FIG. 5A.

Next, an electronics unit 100C in accordance with a second embodiment of the invention is described in detail with reference to FIGS. 5A and 5B with a focus on the difference from FIGS. 2A and 2B of the first embodiment. FIG. 5A is a cross-sectional side view of the electronics unit 100C. FIG. 5B is a partial cross-sectional view of a sealed end face part in FIG. 5A. Note that a main difference between FIGS. 5A, 5B of the second embodiment and FIGS. 2A, 2B of the first embodiment is that, in the first embodiment, the connector housing 200 is attached to both sides of the circuit board 110AB, whereas, in the second embodiment, a connector housing 200 is attached to one side of the circuit board 110CD. Through the drawings, the same or corresponding components are denoted by the same reference numerals.

In FIGS. 5A and 5B, the connector housing 200 bundling a plurality of lead wires 210 is insertably and withdrawably attached to the left end of the electronics unit 100C and connected to an external equipment not shown. This connector housing 200 is configured in the same way as that of the first embodiment. Note that an intermediate adapter 130C having a mounting foot 138C (see FIG. 5B) is bonded and fixed to the left end of the electronics unit 100C.

The connector housing 200 includes a resilient hook 201 (see FIG. 5A) separated from an outer shell 203 (see FIG. 5A) by notched grooves 201a, 201b already described with reference to FIG. 1B, which configures one side of an attachment mechanism. The intermediate adapter 130C includes a retaining engagement part 131 (see FIG. 5B) which configures the other side of the attachment mechanism. This attachment mechanism 201, 131 allows the connector housing 200 to be insertably and withdrawably attached to the electronics unit 100C through the intermediate adapter 130C. Note that the electronics unit 100C includes a mounting foot 138C provided to the intermediate adapter 130C and is mounted and fixed to an mounting surface 300C by a fastening screw not shown.

The electronics unit 100C includes the circuit board 110CD and a plurality of circuit components 111a, 111b solder-mounted on the top and bottom sides of the circuit board 110CD, which are integrally molded with a sealing resin 120 that is a thermosetting resin, such as epoxy resin. The sealing resin 120 includes at the left end a sealed end face part 127 to which the intermediate adapter 130C is to be attached.

The sealed end face part 127 as a part of the sealing resin 120 includes a fitting taper portion 122, an outer concave portion 123, an intermediate convex portion 124 and an inner concave portion 125 in series, in which "inner" means closer to the center of the electronics unit 100C, and "outer" means away from the center.

The fitting taper portion 122 has a slope angle such that the outline size increases from outer portion to inner portion. The outer concave portion 123, the intermediate convex portion 124 and the inner concave portion 125 are configured in a ring shape. Note that a ring-shaped packing 128c, such as silicone rubber, is inserted into the outer concave portion 123, and an inner adhesive material 129a is applied in a ring shape to the inner concave portion 125.

The one intermediate adapter 130C bonded and fixed to the left sealed end face part 127 is a cylindrical part made by injection-molding a thermoplastic resin, such as poly(butylene terephthalate) (PBT). The intermediate adapter 130C includes a fitting taper hole 132 and a fitting abutting face 134.

The intermediate adapter 130C has a step provided on the inner periphery face and includes the fitting abutting face 134 abutting against the outer wall face of the intermediate convex portion 124. The inner end face of the intermediate adapter 130C faces the inner wall face of the inner concave portion 125 with an end face gap G in between (see FIG. 5B).

The sealed end face part 127 is inserted into the intermediate adapter 130C through one opening (inner opening) and the fitting abutting face 134 abuts against the outer wall face of the intermediate convex portion 124, which makes a very small taper gap δ between the fitting taper hole 132 and the fitting taper portion 122. The slope angles of the fitting taper portion 122 and the fitting taper hole 132 are defined such that the orthogonal direction gap size of the taper gap δ increases from an outer gap δ1 (see FIG. 7A) to an inner gap δ2 (see FIG. 7A).

Note that the outer gap δ1 and the gap size of the end face gap G with the fitting abutting face 134 abutting against the intermediate convex portion 124 has a desired size defined to be at least zero or more even when size variation and thermal deformation of the sealed end face part 127 and the intermediate adapters 130C are taken into consideration.

Figure 7A:
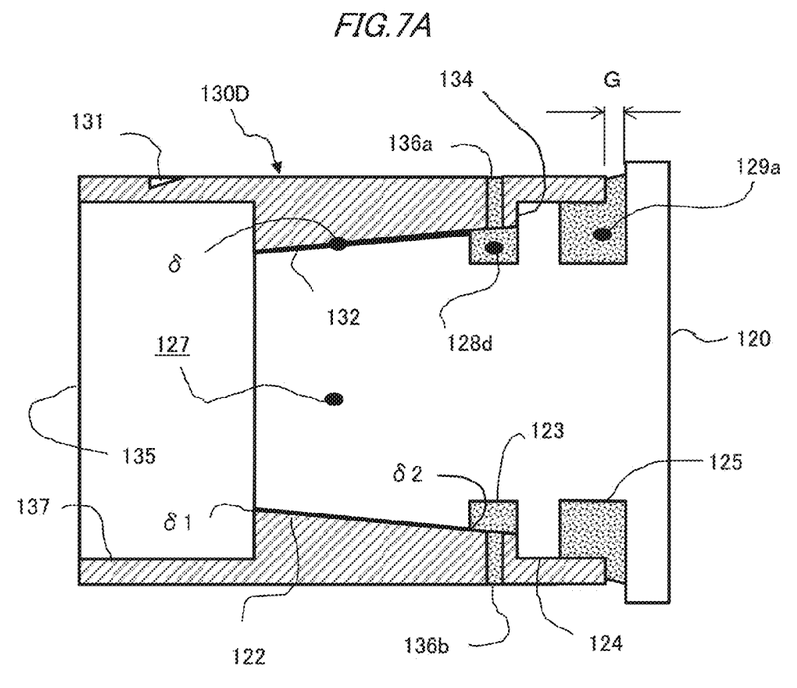
FIG. 7A is a cross-sectional partial view of a sealed end face part in FIG. 6A.
Figure 7B:
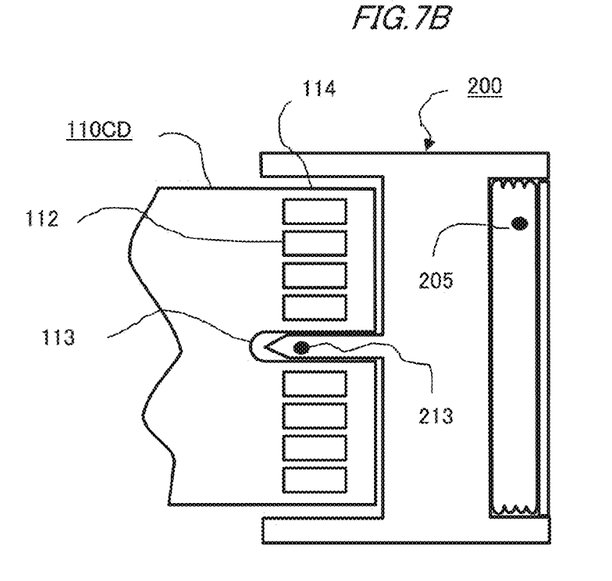
FIG. 7B is a partial plan view of a board edge area in FIG. 6A.

Furthermore, an extended hollow portion 137 is provided between the other opening 135 (outer opening) of the intermediate adapter 130C and the sealed end face part 127, which surrounds the board edge area 114 (see FIG. 7B). Also, the connector housing 200 inserted into the extended hollow portion 137 is configured in a way similar to that of the FIG. 2A.

With the configuration as described above, when the inner adhesive material 129a is applied to the inner concave portion 125, the inner side of the sealed end face part 127 is aimed upward, then, an injection nozzle for creamy adhesive material is moved around and along the inner concave portion 125, and then, the tapered ending portion of the application is caused to overlap with the tapered starting portion to finish the application.

Next, the intermediate adapter 130C loaded on a fabrication jig is fitted onto the sealed end face part 127, and is pressed upward until the fitting abutting face 134 abuts against the wall face of the intermediate convex portion 124. At this time, the fabrication jig includes a dummy projection corresponding to the positioning projection 213 (see FIG. 7B) of the connector housing 200, and the dummy projection is fitted into the notched groove 113 of the circuit board 110CD to prevent the relative positional relationship between the intermediate adapter 130C and the circuit board 110CD from being misaligned. Note that, when a very small fitting gap made between the outer periphery wall of the intermediate convex portion 124 and the inner periphery wall of the intermediate adapter 130C is relatively large due to variation in size of the various portions, the intermediate adapter 130C is fitted onto the sealed end face part 127, then the fitting abutting face 134 abuts against the outer wall of the intermediate convex portion 124, and then part of the inner adhesive material 129a flows into and fills this allowance gap to allow attachment with a small amount of fitting backlash.

(2) Detailed Description of Modification

Figure 6A:
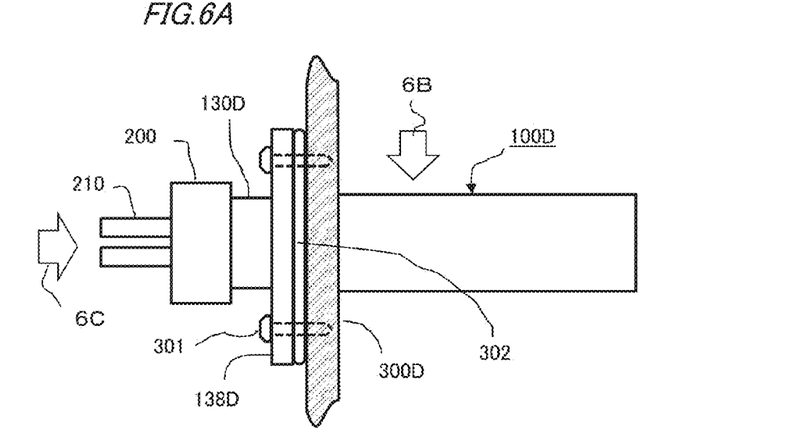
FIG. 6A is an external side view of an electronics unit in accordance with a modification of the second embodiment of the invention.
Figure 6B:
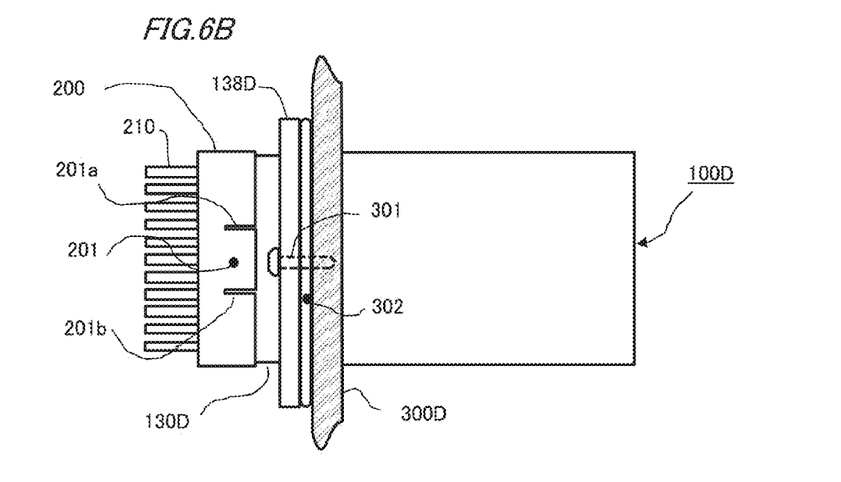
FIG. 6B is an external top view in the direction of arrow 6B in FIG. 6A.
Figure 6C:
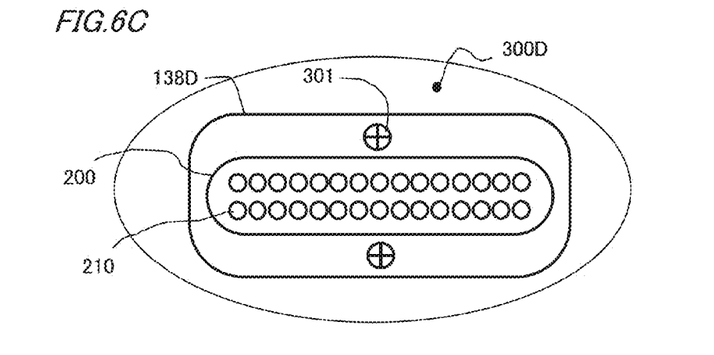
FIG. 6C is an external end view in the direction of arrow 6C in FIG. 6A

Next, an electronics unit 100D in accordance with a modification of the second embodiment of the invention is described in detail with reference to FIG. 6A to 6C with a focus on the difference from FIGS. 1A to 1C of the first embodiment. FIG. 6A is an external side view of the electronics unit 100D. FIG. 6B is an external top view in the direction of arrow 6B in FIG. 6A. FIG. 6C is an external end view in the direction of arrow 6C in FIG. 6A. A main difference between FIGS. 6A to 6C of the second modification and FIGS. 1A to 1C of the first embodiment is that the first embodiment includes the left-and-right pair of connector housings 200 and is installed on a plane, whereas the second modification includes one connector housing 200 and is installed by being fitted into a window hole. Through the drawings, the same or corresponding components are denoted by the same reference numerals.

In FIGS. 6A to 6C, the one connector housing 200 bundling a plurality of lead wires 210 is insertably and withdrawably attached to the left end of the electronics unit 100D and connected to an external equipment not shown. Note that an intermediate adapter 130D having a mounting foot 138D is bonded and fixed to the left end of the electronics unit 100D.

The connector housing 200 includes a resilient hook 201 separated from an outer shell 203 (see FIG. 5A) by notched grooves 201a, 201b (see FIG. 6B), which configures one side of an attachment mechanism. The intermediate adapter 130D includes a retaining engagement part 131 (see FIG. 7A) which configures the other side of the attachment mechanism. This attachment mechanism. 201, 131 allows the connector housing 200 to be insertably and withdrawably attached to the electronics unit 100D through the intermediate adapter 130D.

Note that the electronics unit 100D includes a flange-like mounting foot 138D provided to the intermediate adapter 130D and is mounted and fixed to an mounting surface 300D having a window hole not shown by a fastening screw 301 with a waterproof sheet 302 in between.

Next, FIGS. 7A and 7B are described in detail. FIG. 7A is a cross-sectional partial view of the sealed end face part in FIG. 6A. FIG. 7B is a partial plan view of the board edge area in FIG. 6A. Note that the electronics unit 100D includes the circuit board 110CD previously shown in FIG. 5A and a plurality of circuit components 111a, 111b solder-mounted on the top and bottom sides of the circuit board 110CD, which are integrally molded with a sealing resin 120 that is a thermosetting resin, such as epoxy resin. The sealing resin 120 includes a sealed end face part 127 at the left end.

In FIGS. 7A and 7B, the left sealed end face part 127 as a part of the sealing resin 120 includes a fitting taper portion 122, an outer concave portion 123, an intermediate convex portion 124 and an inner concave portion 125 in series, in which "inner" means closer to the center of the electronics unit 100D, and "outer" means away from the center.

The fitting taper portion 122 has a slope angle such that the outline size increases from outer portion to inner portion. The outer concave portion 123, the intermediate convex portion 124 and the inner concave portion 125 are configured in a ring shape.

Note that an inner adhesive material 129a is applied in a ring shape to the inner concave portion 125. Also, an outer adhesive material 128d is injected into the outer concave portion 123 using a first opening 136a and a second opening 136b provided in the intermediate adapter 130D.

The intermediate adapter 130D bonded and fixed to the left sealed end face part 127 is a cylindrical part made by injection-molding a thermoplastic resin, such as poly(butylene terephthalate) (PBT). The intermediate adapter 130D includes a fitting taper hole 132, a fitting abutting face 134, the first opening 136a and the second opening 136b.

The sealed end face part 127 is inserted into the intermediate adapter 130D through one opening (inner opening) and the fitting abutting face 134 abuts against the outer wall face of the intermediate convex portion 124, which makes a very small taper gap δ between the fitting taper hole 132 and the fitting taper portion 122. The slope angles of the fitting taper portion 122 and the fitting taper hole 132 are defined such that the orthogonal direction gap size of the taper gap δ increases from an outer gap δ1 to an inner gap δ2.

The intermediate adapter 130D has a step provided on the inner periphery face and includes the fitting abutting face 134 abutting against the outer wall face of the intermediate convex portion 124. The inner end face of the intermediate adapter 130D faces the inner wall face of the inner concave portion 125 with an end face gap G in between. The outer gap δ1 and the gap size of the end face gap G with the fitting abutting face 134 abutting against the intermediate convex portion 124 has a desired size defined to be at least zero or more even when size variation and thermal deformation of the sealed end face part 127 and the intermediate adapters 130D are taken into consideration.

Furthermore, an extended hollow portion 137 is provided between the other opening 135 (outer opening) of the intermediate adapter 130D and the sealed end face part 127, which surrounds the board edge area 114 (see FIG. 7B). Also, the connector housing 200 inserted into the extended hollow portion 137 is configured in a way similar to that of the FIG. 2A.

With the configuration as described above, when the inner adhesive material 129a is applied to the inner concave portion 125, the inner side of the sealed end face part 127 is aimed upward, then, an injection nozzle for creamy adhesive material is moved around and along the inner concave portion 125, and then, the tapered ending portion of the application is caused to overlap with the tapered starting portion to finish the application.

Next, the intermediate adapter 130D loaded on a fabrication jig is fitted onto the sealed end face part 127, and is pressed upward until the fitting abutting face 134 abuts against the wall face of the intermediate convex portion 124.

At this time, the fabrication jig includes a dummy projection corresponding to the positioning projection 213 (see FIG. 7B) of the connector housing 200, and the dummy projection is fitted into the notched groove 113 (see FIG. 7B) of the circuit board 110CD to prevent the relative positional relationship between the intermediate adapter 130D and the circuit board 110CD from being misaligned.

With the intermediate adapter 130D attached, the outer adhesive material 128d injected into the outer concave portion 123 is pressure-injected through the first opening 136a and pushed out through the second opening 136b or is supplied through the first opening 136a and vacuum-sucked through the second opening 136b.

Note that, when a very small fitting gap made between the outer periphery wall of the intermediate convex portion 124 and the inner periphery wall of the intermediate adapter 130D or the inner gap δ2 of the taper gap δ is relatively large due to variation in size of the various portions, part of the outer adhesive material 128d and/or the inner adhesive material 129a flows into and fills this allowance gap to allow attachment with a small amount of fitting backlash. However, in order to prevent the outer adhesive material 128d from flowing out beyond the outer gap δ1 of the taper gap δ, the size in the direction from inside to outside of the taper gap δ is set to be larger, and the outer gap δ1 is set to be smaller.

(3) Point and Feature of Second Embodiment and Second Modification

As is obvious from the above description, the electronics unit 100C, 100D in accordance with the second embodiment and second modification of the invention is a card-edge terminal type electronics unit 100C, 100D including a circuit board 110CD on which a plurality of circuit components 111a, 111b are mounted, the circuit board including a plurality of copper foil trace terminals 112 provided on at least one surface of the top and bottom surfaces of the edge of a first side or a second side in parallel with the first side of the circuit board, the copper foil trace terminals 112 being pressed by a copper-based resilient contact 211b.

The circuit board 110CD and the plurality of circuit components 111a, 111b are integrally molded with a sealing resin 120 that is a thermosetting resin excepting a board edge area 114 in which the copper foil trace terminals 112 are provided.

A cylindrical intermediate adapter 130C, 130D has one opening bonded and fixed to a sealed end face part 127 that is included in a board area close to the board edge area 114 and is part of the sealing resin 120 and has the other opening 135 that surrounds the board edge area 114.

A receptacle body 202 of a connector housing 200 is inserted into the other opening 135, the connector housing 200 including the resilient contact 211b press-fitted and fixed thereto and connected to a lead wire 210 for external connection, which causes the resilient contact 211b to be in electrical contact with the copper foil trace terminals 112.

The connector housing 200 and the intermediate adapter 130C, 130D are each formed of a thermoplastic resin, and a set of insertable and withdrawable retaining attachment mechanism 201, 131 is provided to one and the other of the connector housing 200 and the intermediate adapter 130C, 130D.

The connector housing 200 further includes a positioning projection 213 that is fitted into a notched groove 113 provided in the end face of the circuit board 110CD.

The intermediate adapter 130C, 130D is bonded to the sealed end face part 127 of the sealing resin 120 with an adhesive material 129a, 128d and 129a that is an elastic adhesive material having an adhesive viscosity enough to prevent peeling caused by thermal deformation due to difference in linear expansion coefficient between the intermediate adapter 130C, 130D and the sealing resin 120.

The sealed end face part 127 of the sealing resin 120 includes an intermediate convex portion 124, an outer concave portion 123 more outer than the intermediate convex portion 124, and an inner concave portion 125 more inner than the intermediate convex portion 124, and the outer concave portion 123 is placed closer to the connector housing 200 than the intermediate convex portion 124.

A fitting taper portion 122 more outer than the outer concave portion 123 is provided, and is fitted into a fitting taper hole 132 of the intermediate adapter 130C, 130D to make a taper gap δ having slope angles.

The slope angles of the fitting taper portion 122 and the fitting taper hole 132 are defined such that the orthogonal direction gap size of the taper gap δ increases from an outer gap δ1 to an inner gap δ2.

The intermediate adapter 130C, 130D has a step provided on the inner periphery face and includes a fitting abutting face 134 abutting against the outer wall face of the intermediate convex portion 124, and the inner end face of the intermediate adapter 130C, 130D faces the inner wall face of the inner concave portion 125 with an end face gap G in between.

The outer gap δ1 and the gap size of the end face gap G with the fitting abutting face 134 abutting against the intermediate convex portion 124 has a desired size defined to be at least zero or more even when size variation and thermal deformation of the sealed end face part 127 and the intermediate adapters 130C, 130D are taken into consideration.

At least one concave portion of the outer concave portion 123 and the inner concave portion 125 is filled with the adhesive material 129a, 128d and 129a in a ring shape.

As described above, with reference to claim 2 of the invention, the sealed end face part of the sealing resin includes the fitting taper portion, the outer concave portion, the intermediate convex portion and the inner concave portion placed in series, the one opening end of the intermediate adapter fitted onto the sealed end face part faces the inner wall face of the inner concave portion with the end face gap G in between, the intermediate end face is the fitting abutting face that abuts against the outer wall face of the intermediate convex portion, and at least one concave portion of the outer concave portion and the inner concave portion is filled with the adhesive material.

Accordingly, the sealed end face part includes the fitting taper portion, which facilitates the insertion of the intermediate adapter into the sealed end face part of the sealing resin, and restricting the insertion position by the fitting abutting face can reduce the gap size of the taper gap δ to suppress the occurrence of assembly dimension error and can also prevent crack failure of a sealing resin exposed by the one opening end face of the intermediate adapter not abutting against the sealing resin due to thermal deformation.

An elastic ring-shaped packing 128c is wound around the outer concave portion 123, and the inner adhesive material 129a is applied in a ring shape to the inner concave portion 125.

As described above, with reference to claim 5 of the invention, an elastic ring-shaped packing is wound around the outer concave portion of the sealed end face part, and an adhesive material is applied in a ring shape to the inner concave portion.

Accordingly, the adhesive material provides adhesive strength and the ring-shaped packing shares waterproofing capability with the adhesive material, which can increase the life of adhesive and waterproofing capability. Note that the inner adhesive material is applied in a ring shape with the sealed end face part exposed, so, the tapered ending portion of the application is caused to overlap with the tapered starting portion to perform gradual joining, which improves waterproofing capability at the joint.

The intermediate adapter 130D is fitted onto the sealed end face part 127 with the inner adhesive material 129a applied in a ring shape to the inner concave portion 125.

The intermediate adapter 130D includes in its outer periphery a first opening 136a facing the outer periphery of the outer concave portion 123 provided in the sealed end face part 127 and a second opening 136b provided opposite to the first opening 136a.

The outer concave portion 123 is filled with the outer adhesive material 128d that is pressure-injected through the first opening 136a and pushed out through the second opening 136b or is supplied through the first opening 136a and vacuum-sucked through the second opening 136b.

As described above, with reference to claim 6 of the invention, the inner adhesive material is applied in a ring shape to the inner concave portion, and the outer adhesive material is injected through the first opening provided in the intermediate adapter, then is divided into two streams and runs halfway around the outer concave portion, and then joins together at the second opening.

This can increase the adhesive area of the adhesive material to improve adhesive strength and waterproofing capability. Also, the inner adhesive material is applied in a ring shape with the sealed end face part exposed, so, the tapered ending portion of the application is caused to overlap with the tapered starting portion to perform gradual joining, which improves waterproofing capability at the joint.

Furthermore, the intermediate adapter includes the inlet and outlet for the outer adhesive material, which can prevent a void (air trap) from occurring in the outer concave portion.

The intermediate adapter 130C, 130D is bonded and fixed to the sealed end face part 127 of the sealing resin 120 at the first side of the circuit board 110CD.

The intermediate adapter 130C, 130D includes a mounting foot 138C, 138D integrated therewith in parallel with or perpendicular to the plane of the circuit board 110CD, and the intermediate adapter 130C, 130D with this mounting foot 138C, 138D is mounted and fixed to an mounting plane 300C, 300D that is an upright or inclined wall face along the vertical direction or a floor or ceiling.

As described above, with reference to claim 7 of the invention, the intermediate adapter includes the mounting foot of the electronics unit integrally molded therewith in parallel with or perpendicular to the circuit board.

Accordingly, various mounting specifications of the electronics unit can be satisfied by replaceably applying an appropriate intermediate adapter. Furthermore, when a vibration and/or impact is applied to the mounting surface, the vibration and/or impact is absorbed by the adhesive material that secures the intermediate adapter, which can prevent an excess vibration and/or impact from being applied to a key portion of the sealing resin and prevent crack failure of the portion.

The intermediate adapter 130D is bonded and fixed to the sealed end face part 127 of the sealing resin 120 at the first side of the circuit board 110CD.

The intermediate adapter 130D includes the mounting foot 138D integrated therewith perpendicular to the circuit board 110CD, and the intermediate adapter 130D with this mounting foot 138D is fixed by screw to an mounting plane 300D at the surrounding part of an opening window hole of the mounting plane 300D with a waterproof sheet 302 in between.

As described above, with reference to claim 8 of the invention, the intermediate adapter includes the mounting foot of the electronics unit integrally molded therewith perpendicular to the circuit board and attached through the window hole of the mounting surface.

Accordingly, various mounting specifications of the electronics unit can be satisfied by replaceably applying an appropriate intermediate adapter. Also, with an environment space divided by the mounting surface, the electronics unit can be placed in the better side of the environment The electronics unit in accordance with the first and second embodiments of the invention and the electronics unit in accordance with their modifications have been described. However, according to the invention, the embodiments may be freely combined or the embodiments may be appropriately modified or omitted within the scope of the invention.

What is claimed is:

1. A card-edge terminal type electronics unit comprising:
a circuit board on which a plurality of circuit components are mounted, the circuit board including a plurality of copper foil trace terminals provided on at least one surface of a top and bottom surfaces of an edge of a first side or a second side in parallel with the first side of the circuit board, the copper foil trace terminals being pressed by a copper-based resilient contact,
wherein the circuit board and the plurality of circuit components are integrally molded with a sealing resin that is a thermosetting resin excepting a board edge area in which the copper foil trace terminals are provided,
wherein a cylindrical intermediate adapter has one opening bonded and fixed to a sealed end face part that is included in a board area close to the board edge area and is a part of the sealing resin and has an other opening that surrounds the board edge area,
wherein a receptacle body of a connector housing is inserted into the other opening, the connector housing including the resilient contact press-fitted and fixed to the connector housing and connected to a lead wire for external connection, which causes the resilient contact to be in electrical contact with the copper foil trace terminals,
wherein the connector housing and the intermediate adapter are each formed of a thermoplastic resin, and a set of insertable and withdrawable retaining attachment mechanism is provided to one and the other of the connector housing and the intermediate adapter,
wherein the connector housing further includes a positioning projection press-fitted and fixed to the connector housing, the positioning projection being fitted into a notched groove provided in the end face of the circuit board, and
wherein the intermediate adapter is bonded to the sealed end face part of the sealing resin with an adhesive material that is an elastic adhesive material having an adhesive viscosity enough to prevent peeling caused by thermal deformation due to difference in linear expansion coefficient between the intermediate adapter and the sealing resin.

2. The electronics unit according to claim 1,
wherein the sealed end face part of the sealing resin includes an intermediate convex portion, an outer concave portion more outer than the intermediate convex portion, and an inner concave portion more inner than the intermediate convex portion, and the outer concave portion is placed closer to the connector housing than the intermediate convex portion,
wherein a fitting taper portion more outer than the outer concave portion is provided, and is fitted into a fitting taper hole of the intermediate adapter to make a taper gap $\delta$ having slope angles,
wherein the slope angles of the fitting taper portion and the fitting taper hole are defined such that the orthogonal direction gap size of the taper gap $\delta$ increases from an outer gap $\delta 1$ to an inner gap $\delta 2$,
wherein the intermediate adapter has a step provided on the inner periphery face and includes a fitting abutting face abutting against the outer wall face of the intermediate convex portion, and the inner end face of the intermediate adapter faces the inner wall face of the inner concave portion with an end face gap in between,
wherein the outer gap $\delta 1$ and the gap size of the end face gap with the fitting abutting face abutting against the intermediate convex portion has a desired size defined to be at least zero or more even when size variation and thermal deformation of the sealed end face part and the intermediate adapters are taken into consideration, and
wherein at least one concave portion of the outer concave portion and the inner concave portion is filled with the adhesive material in a ring shape.

3. The electronics unit according to claim 2,
wherein the intermediate adapter includes a plurality of fitting protrusions or a ring-shaped fitting protrusion provided on the fitting taper hole, and each of the fitting protrusion is forcibly fitted into the outer periphery of the outer concave portion provided in the sealed end face part, and
wherein the fitting protrusions mechanically prevents the intermediate adapter from coming off the sealed end face part, and the inner adhesive material is applied in a ring shape to the inner concave portion.

4. The electronics unit according to claim 2,
wherein the intermediate adapter is fitted onto the sealed end face part with the outer adhesive material applied in a ring shape to the outer concave portion, and
wherein the intermediate convex portion includes a through channel that is a plurality of depressions provided in the outer periphery thereof, and the inner adhesive material is provided in the inner concave portion as a result of the outer adhesive material being pressed by the intermediate adapter to overflow through the through channel into the inner concave portion.

5. The electronics unit according to claim 2, wherein
an elastic ring-shaped packing is wound around the outer concave portion, and the inner adhesive material is applied in a ring shape to the inner concave portion.

6. The electronics unit according to claim 2,
wherein the intermediate adapter is fitted onto the sealed end face part with the inner adhesive material applied in a ring shape to the inner concave portion,
wherein the intermediate adapter includes in its outer periphery a first opening facing the outer periphery of the outer concave portion provided in the sealed end face part and a second opening provided opposite to the first opening, and
wherein the outer concave portion is filled with the outer adhesive material that is pressure-injected through the first opening and pushed out through the second opening or is supplied through the first opening and vacuum-sucked through the second opening.

7. The electronics unit according to claim 1,
wherein the intermediate adapter is bonded and fixed to the sealed end face part of the sealing resin at the first side or at both the first and second sides of the circuit board, and
wherein at least one of the intermediate adapters includes a mounting foot integrated therewith in parallel with or perpendicular to the plane of the circuit board, and the intermediate adapter with the mounting foot is mounted and fixed to a mounting plane that is an upright or inclined wall face along the vertical direction or a floor or ceiling.

8. The electronics unit according to claim 7,
wherein the intermediate adapter is bonded and fixed to the sealed end face part of the sealing resin at the first side or at both the first and second sides of the circuit board, and
wherein one of the intermediate adapters includes the mounting foot integrated therewith perpendicular to the circuit board, and the intermediate adapter with the mounting foot is fixed by a screw to the mounting plane at the surrounding part of an opening window hole of the mounting plane with a waterproof sheet in between.

* * * * *